United States Patent [19]

Embree et al.

[11] 4,354,122

[45] Oct. 12, 1982

[54] VOLTAGE TO CURRENT CONVERTER

[75] Inventors: Milton L. Embree, Reading, Pa.; William G. Garrett, Canton Township, Wayne County, Mich.

[73] Assignee: Bell Telephone Laboratories, Incorporated, Murray Hill, N.J.

[21] Appl. No.: 176,346

[22] Filed: Aug. 8, 1980

[51] Int. Cl.³ .............................................. H03K 3/36
[52] U.S. Cl. .................................. 307/261; 307/264; 323/316
[58] Field of Search ................... 307/264, 270, 296 R, 307/297, 261; 323/312–316, 350

[56] References Cited

U.S. PATENT DOCUMENTS

| B 501,181 | 2/1976 | Edington et al. | 307/304 X |
|---|---|---|---|
| 3,909,628 | 9/1975 | Muto | 323/315 X |
| 4,004,247 | 1/1977 | Plassche | 323/315 X |
| 4,016,435 | 4/1977 | Voorman | 307/296 R |
| 4,019,121 | 4/1977 | Feindt | 323/315 |
| 4,045,694 | 8/1977 | Ahmed | 307/296 R |
| 4,055,774 | 10/1977 | Ahmed | 307/296 R |
| 4,057,743 | 11/1977 | Limberg | 307/296 R |
| 4,093,907 | 6/1978 | Nutz | 323/315 |
| 4,145,649 | 3/1979 | Pickton | 323/350 |
| 4,168,528 | 9/1979 | Comer | 307/296 R |

OTHER PUBLICATIONS

Gilbert, "Simulation of Inductors and Capacitors using Operational-Amplifier Compensation Pole: A Caution", Electronics Letters, vol. 14, No. 25, Dec. 7, 1978, p. 832.
Hart, "Circuit Technique for Wide-Range Linear, Voltage-to-Current Convertors", Electronics Letters, vol. 12, No. 12, Jun. 1976, pp. 298, 299.
Scholtzhauer et al., "A Precision Bipolar Current Differencing Amplifier", IEEE Journal of Solid-State Circuits, vol. SC-8, No. 6, Dec. 1973, pp. 456-458, 323-315.
Van Zanten et al., "An accurate Integrated Voltage-to-Current Converter", IEEE Journal of Solid-State Circuits, vol. SC-10, No. 6, Dec. 1975, pp. 432-436.
Caprio, "Precision Differential Voltage-Current Convertor", Electronics Letters, vol. 9, No. 6, Mar. 1973, pp. 147-148.

Primary Examiner—A. D. Pellinen
Attorney, Agent, or Firm—David H. Tannenbaum

[57] ABSTRACT

In situations where it is desired to provide an extremely accurate output current generated from an input voltage, errors occur in the conversion. Conventional solutions depend upon operational amplifiers and rely upon the availability of both positive and negative reference voltages. When attempting to design an integrated circuit having accurate output currents using only integrated circuit technology the circuit components introduce undesirable errors. These problems have been overcome by an arrangement which includes a current mirror (104, 105) for providing the output current and also for providing a feedback current (101, 102) for use in modifying the current flowing in an input emitter follower (103). Using this approach, the base emitter voltages of the emitter follower transistor and the input transistor of the current mirror are forced to cancel each other. By adjusting the current densities of the two transistors, substantially perfect error compensation is achieved.

4 Claims, 4 Drawing Figures

VOLTAGE TO CURRENT CONVERTER

TECHNICAL FIELD

This invention relates to a circuit for accurately converting an input voltage to an output current and more particularly to such a circuit operable from a single voltage source and operable over a wide range of input voltages.

BACKGROUND OF THE INVENTION

In circuit technology, and especially in integrated circuits, it is desirable to convert an input voltage to an output current without the introduction of errors in the conversion. One such arrangement for accomplishing this result is to use an operational amplifier, a transistor and a resistor. However, this arrangement has disadvantages since the op amp must have a negative voltage source and since it requires a relatively large semiconductor area in integrated circuit applications.

Circuits not requiring an operational amplifier have been devised, for example, the circuit of VanZenter and Huijging shown in the IEEE Journal of Solid State Circuits, Vol. SC-10, No. 6, December 1975, page 432, for converting differential voltages to a current. Such circuits have a non-linearity problem since the current through the resistor causes the input transistor base-emitter voltage to rise while the output transistor base-emitter voltage falls unequally. In essence then, the prior art circuits suffer from the problem that there is a voltage drop across the various transistor junctions, which voltage drop is logarithmically related to the current. In such situations, the temperature also plays a large role in making the circuit inaccurate.

SUMMARY OF THE INVENTION

We have solved the foregoing problem by a circuit arrangement which includes a current mirror for providing the output current and for also providing a feedback current for use in controlling the current flowing in an input emitter follower. Using this approach base emitter voltages of the emitter follower transistor and the input transistor of the current mirror are forced to cancel each other. By designing the emitter areas of the two transistors correctly, substantially perfect error compensation is achieved.

At the heart of our circuit is the arrangement by which the base to emitter voltage of the input emitter follower transistor is made to match the base to emitter voltage of the input current mirror transistor over a wide range of input voltages and temperatures. The circuit is configured such that these voltages cancel each other and the current flowing into the current mirror is equal to the input voltage divided by the series resistor between the emitter follower and the current mirror.

BRIEF DESCRIPTION OF THE DRAWING

The principle of our invention as well as additional advantages and objectives thereof will be more fully appreciated from a review of the illustrative embodiment shown in the drawing in which.

DETAILED DESCRIPTION

Figure 2:
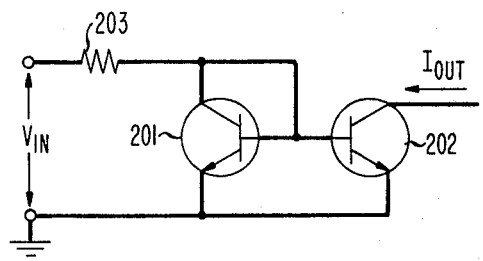
FIGS. 2 and 3 show various prior art voltage to current arrangements.

Prior to beginning a discussion of the operation of our invention it might be helpful to review briefly the operation of some of the prior art circuits which also address this same problem. In FIG. 2 there is shown a resistor 203 and a current mirror 201, 202 used to convert a single-ended input voltage to an output current. Assuming that the transistors are matched and their current gains ($\beta$'s) are high enough so that base currents are negligible, the voltage to current equations for this circuit are as follows:

$$V_{IN} = V_{R203} + V_{BE201} \quad (1)$$

$$I_{IN} = \frac{V_{R203}}{R_{203}} = \frac{V_{IN} - V_{BE201}}{R_{203}} \quad (2)$$

$$V_{BE201} = V_T \ln \frac{I_{C201}}{I_{S201}} \quad (3)$$

where
$V_T = KT/q$ = thermal voltage of transistor ($\sim 26$ mV at 25° C.)
$K$ = Boltzmans constant
$T$ = Absolute temperature
$q$ = Electron charge
$I_{S201}$ = saturation current of transistor ($\sim$proportional to emitter area)

$$I_{C201} = I_{IN} = I_{C202} = I_{OUT} \quad (4)$$

Combining (2), (3), and (4):

$$I_{OUT} = \quad (5)$$

$$\frac{V_{IN} - V_T \ln \frac{I_{OUT}}{I_{S201}}}{R_{203}} = \frac{V_{IN}}{R_{203}} - \frac{V_T \ln \frac{I_{OUT}}{I_{S201}}}{R_{203}}$$

Since the desired linear output current is represented by the first term in equation (5), the second term is an error term which is logarithmic and has a large temperature coefficient.

Figure 3:
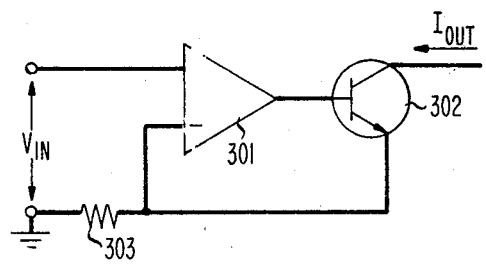

In FIG. 3 there is shown an operational amplifier 301, transistor 302 and resistor 303 which can be used to accurately convert a single ended voltage to a current. As discussed priorly one disadvantage of this circuit is that the op amp normally must have a negative source of supply and is an inherently complex circuit. In addition, the output voltage must be maintained greater than the input voltage if the circuit is to function properly.

Figure 1:
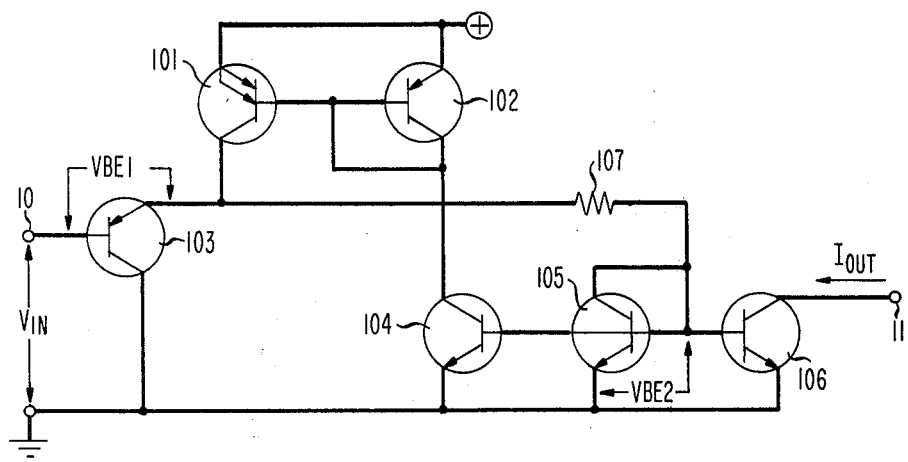
FIG. 1 shows a schematic illustrating the principles of our circuit.

Referring now to the simplified schematic for the high accuracy zero temperature coefficient voltage to current converter shown in FIG. 1, the voltage signal, $V_{IN}$, is applied to the base of transistor 103. Transistor 103 forms an emitter follower which provides a voltage signal at the emitter of transistor 103 which follows the voltage signal input. Note that the current mirror formed of transistors 104, 105 and 106 has an input voltage level at the base of transistor 105 which is one diode drop above ground. That diode drop is equal to the diode drop of the emitter base voltage of transistor 103 thus making the voltage drop across resistor 107 identical with the input voltage signal. That would be true if the collector current of transistor 103 exactly matched the collector current of transistor 105 and the transistor saturation current characteristics matched each other and if the transistor current gains were large enough to make the base currents negligible. In order to accomplish this, the current fed to the emitter of transistor 103 and to resistor 107 is made equal to two times the current flowing in resistor 107. The circuit for accomplishing this is composed of the two current mirrors formed by transistors 104, 105, and 106 and transistors 101 and 102. The emitter area of transistors 101 is made double so that the saturation current of transistor 101 will be double that of transistor 102. This makes the collector current of transistor 101 twice that of transistor 102.

Again assuming that the transistors are matched and that their current gains ($\beta$'s) are high enough so that base currents are negligible, the voltage to current equations for the circuit of FIG. 1 are as follows:

$$V_{In} = -V_{BE103} + V_{R107} + V_{BE105} \quad (6)$$

$$I_{R107} = I_{C105} = I_{C106} = I_{OUT} \quad (7)$$

$$I_{C104} = I_{C105} = I_{R107} \quad (8)$$

$$I_{C101} = 2I_{C102} = 2I_{C104} = 2I_{R107} \quad (9)$$

$$I_{C103} = I_{E103} = I_{C101} - I_{R107} \quad (10)$$

$$\therefore I_{C103} = 2I_{R107} - I_{R107} = I_{R107} \quad (11)$$

$$V_{BE103} = V_T \ln I_{C103}/I_{S103} \quad (12)$$

$$V_{BE105} = V_T \ln I_{C105}/I_{S105} \quad (13)$$

Now by equations (8) and (11)

$$I_{C103} = I_{C105} = I_{R107}$$

and since the transistors are matched to make $I_{S103} = I_{S105}$ then:

$$V_{BE103} = V_{BE105}$$

then: by substitution into equation (6):

$$V_{IN} = V_{R107}$$

now:

$$I_{OUT} = I_{R107} = V_{R107}/R_{107} = V_{IN}/R_{107} \quad (14)$$

This result indicates that the circuit is error free if the high transistor gain and transistor matching assumptions are valid.

Figure 4:
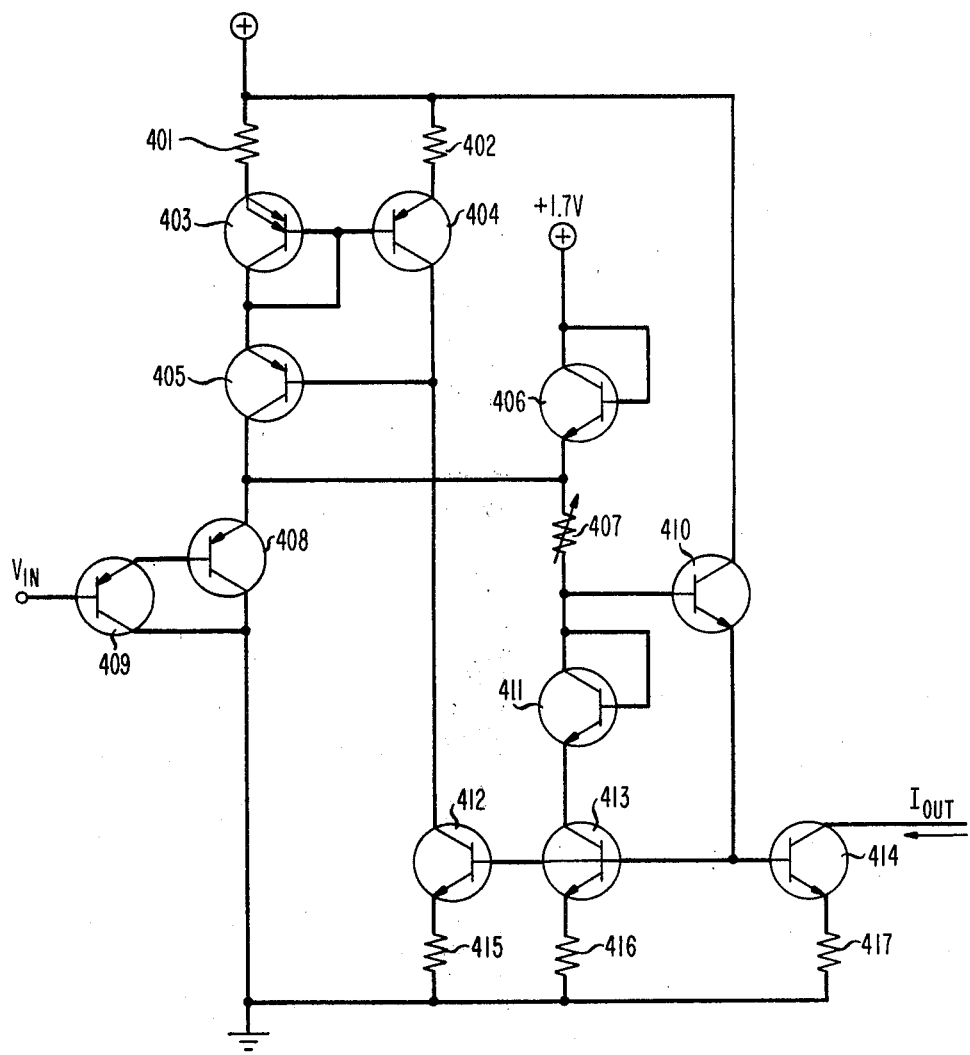
FIG. 4 shows a schematic illustrating our inventive contribution in a more detailed circuit.

Turning now to FIG. 4, there is shown a more detailed version of the circuit shown in FIG. 1. This is the circuit used to realize the concepts discussed. Current through resistor 407 flows through diode-connected transistor 411 and forms the collector current of transistor 413 in the current mirror configuration, where the output current is equal to the current in transistor 413's collector. Since the bases of transistors 413, 414 and 412 are common and the degeneration resistors are equal, the collector current of transistor 412 is also equal to the collector currents of transistors 413 and 414.

The collector current of transistor 412 goes to a current mirror formed of transistors 405, 403 and 404. The degeneration resistor 402 of transistor 404 is made twice the value of the degeneration resistor for transistor 403 and transistor 403 is made with an emitter area twice that of transistor 404. Thus, the collector current of transistor 403 will be twice that of transistor 404, and the collector current of buffer transistor 405 is approximately twice the current that flows in resistor 407. This double current is applied to the junction of transistor 408 and resistor 407 such that the emitter current of transistor 408 will be the same as the emitter current of transistor 413, so that the base to emitter voltage drop across those two transistors will be equal.

The emitter current of transistor 409 is equal to the emitter current of transistor 408 divided by the current gain (beta)—in the same manner that the emitter current of transistor 410 is equal to the total collector current of transistors 412, 413 and 414 divided by beta. By making transistor 410 three times as large as the other transistors, the base-emitter voltage drop across transistor 410 will match the voltage drop across the emitter base of transistor 409.

It is important to note why two times the current through resistor 407 is provided by the collector of transistor 405. First, one part of that current supplies resistor 407 current itself, and that means that the other part of that current flows as emitter current to transistor 408, which is exactly what is necessary to provide the base-emitter voltages for cancellation. Note that approximately the same current that flows through resistor 407 flows through resistor 416 so it is really the series combination of resistors 407 and 416 that have the same voltage drop across them as the input voltage. Resistor 416 is needed as a degeneration for the current mirror—that degeneration function is made up of resistors 415, 416 and 417. Transistor 406 serves a start-up function.

Note that the cancellation of the circuit is dependent upon the emitter base voltage drops of PNP transistors 409 and 408, matching the emitter base voltage drops of transistors 410 and 413, which are NPN transistors. Using bipolar integrated circuit technology, these PNP and NPN transistors can be made to have similar base-emitter voltage drops for appropriate collector currents and almost identical temperature coefficients. The zero temperature coefficient for the resistance combination is approximately obtained by making resistor 407 a thin film resistor having a small positive temperature coefficient and resistors 415, 416 and 417 silicon resistors having a larger negative temperature coefficient. By making the resistance values inversely proportional to the magnitudes of the temperature coefficients, the series combination has a zero temperature coefficient.

This circuit then provides a highly accurate transformation from an input voltage to an output current with an approximately zero temperature coefficient. Thus, $I_{OUT}$ is equal to $V_{IN}$ divided by resistor 407 plus resistor 416 to within a tenth of a percent over a wide temperature range.

We claim:

1. A voltage to current converter circuit having a high input impedance and zero temperature coefficient for providing an accurate output current from an input voltage, said circuit comprising:
   an input circuit for accepting applied voltages, including first and second transistors arranged to provide a high input impedance,
   third and fourth mirror connected transistors arranged as an output current mirror and having commonly connected base electrodes, an impedance connected between the emitter electrode of said second transistor and said fourth transistor, fifth and sixth mirror connected transistors connected respectively to the emitter of said second transistor and to the collector of said third transistor to ensure that the current flow through said input circuit equals the current flow through said output current mirror, means, including a seventh transistor for compensating for the base to emitter voltage drop of said first transistor, said compensating transistor having its base connected to said impedance and its emitter connected to said base of said fourth transistor, said fourth transistor functioning to compensate for the base to emitter voltage drop of said second transistor, an output circuit including an eighth transistor having its base electrode connected to said commonly connected base electrodes of said output current mirror, and clamping means responsive to said input voltage for providing an output current whenever said input voltage decreases below a predetermined threshold.

2. The invention set forth in claim 1 wherein said first and second transistors are Darlington connected.

3. The invention set forth in claim 1 wherein said seventh transistor is constructed to have a saturation current three times as large as the saturation current of said first transistor.

4. The invention set forth in claim 1 wherein said clamping means is a diode connected transistor.

* * * * *